(12) United States Patent
Shindo et al.

(10) Patent No.: US 12,009,240 B2
(45) Date of Patent: Jun. 11, 2024

(54) APPARATUS FOR TRANSPORTING SUBSTRATE, SYSTEM FOR PROCESSING SUBSTRATE, AND METHOD OF TRANSPORTING SUBSTRATE

(71) Applicant: Tokyo Electron Limited, Tokyo (JP)

(72) Inventors: Takehiro Shindo, Nirasaki (JP); Toshiaki Kodama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 125 days.

(21) Appl. No.: 17/656,431

(22) Filed: Mar. 25, 2022

(65) Prior Publication Data

US 2022/0319889 A1 Oct. 6, 2022

(30) Foreign Application Priority Data

Mar. 30, 2021 (JP) ................................. 2021-058376

(51) Int. Cl.
*H01L 21/677* (2006.01)
(52) U.S. Cl.
CPC .. *H01L 21/67745* (2013.01); *H01L 21/67742* (2013.01); *H01L 21/67748* (2013.01)
(58) Field of Classification Search
None
See application file for complete search history.

(56) References Cited

U.S. PATENT DOCUMENTS

| 7,959,395 | B2 * | 6/2011 | Hofmeister | ....... H01L 21/67161 |
| | | | | 414/217 |
| 10,483,880 | B2 * | 11/2019 | Peck, Jr. | ................... H02P 5/00 |
| 10,737,403 | B2 * | 8/2020 | Bauer | ..................... B26D 7/32 |
| 11,527,424 | B2 * | 12/2022 | Berger | ................... B65G 54/02 |

FOREIGN PATENT DOCUMENTS

JP 2018-504784 A 2/2018

* cited by examiner

*Primary Examiner* — Michael S Lowe
(74) *Attorney, Agent, or Firm* — Armstrong Teasdale LLP

(57) ABSTRACT

An apparatus for transporting a substrate includes a transport chamber including a wall having an opening through which carry-in/out of the substrate to/from the substrate processing chamber is performed and a movement surface having a first magnet, a transport module accommodated in the transport chamber to hold the substrate, including a second magnet to which a magnetic force is applied, and configured to be movable along the movement surface in a floating state from the movement surface, an angle adjusting mechanism provided in the transport chamber to switch an angle of the movement surface between a first angle and a second angle which is closer to a vertical state than the first angle, and a transport passage forming a portion of the transport chamber, and including the movement surface at the second angle to which the movement surface switched to the second angle can be connected.

14 Claims, 16 Drawing Sheets

APPARATUS FOR TRANSPORTING SUBSTRATE, SYSTEM FOR PROCESSING SUBSTRATE, AND METHOD OF TRANSPORTING SUBSTRATE

CROSS-REFERENCE TO RELATED APPLICATION

This application is based upon and claims the benefit of priority from Japanese Patent Application No. 2021-058376, filed on Mar. 30, 2021, the entire contents of which are incorporated herein by reference.

TECHNICAL FIELD

The present disclosure relates to an apparatus for transporting a substrate, a system for processing a substrate, and a method of transporting a substrate.

BACKGROUND

For example, in an apparatus that performs processing on a semiconductor wafer (hereinafter, also referred to as a "wafer") which is a substrate, wafer transport is performed between a carrier that accommodates wafers and a wafer processing chamber in which the processing is performed. When transporting wafers, wafer transport mechanisms having various configurations are used.

For example, a substrate carrier that conveys a semiconductor substrate between processing chambers in a state of floating from a plate using magnetic levitation is described in Patent Document 1.

PRIOR ART DOCUMENT

Patent Document

Japanese Laid-Open Patent Publication No. 2018-504784

SUMMARY

According to one embodiment of the present disclosure, an apparatus for transporting a substrate to/from a substrate processing chamber in which substrate processing is performed, includes: a substrate transport chamber connected to the substrate processing chamber, and including a side wall having an opening through which carry-in/out of the substrate to/from the substrate processing chamber is performed and a movement surface provided with a first magnet; a plate-shaped substrate transport module accommodated in the substrate transport chamber to hold the substrate, including a second magnet to which a magnetic force that is at least one of a repulsive force or an attractive force acting between the first magnet and the second magnet is applied, and configured to be movable along the movement surface in a state of floating from the movement surface using the magnetic force; an angle adjusting mechanism provided in the substrate transport chamber to switch an angle of the movement surface between a first angle and a second angle which is closer to a vertical state than the first angle; and a transport passage forming a portion of the substrate transport chamber, and including the movement surface at the second angle to which the movement surface switched to the second angle by the angle adjusting mechanism can be connected.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
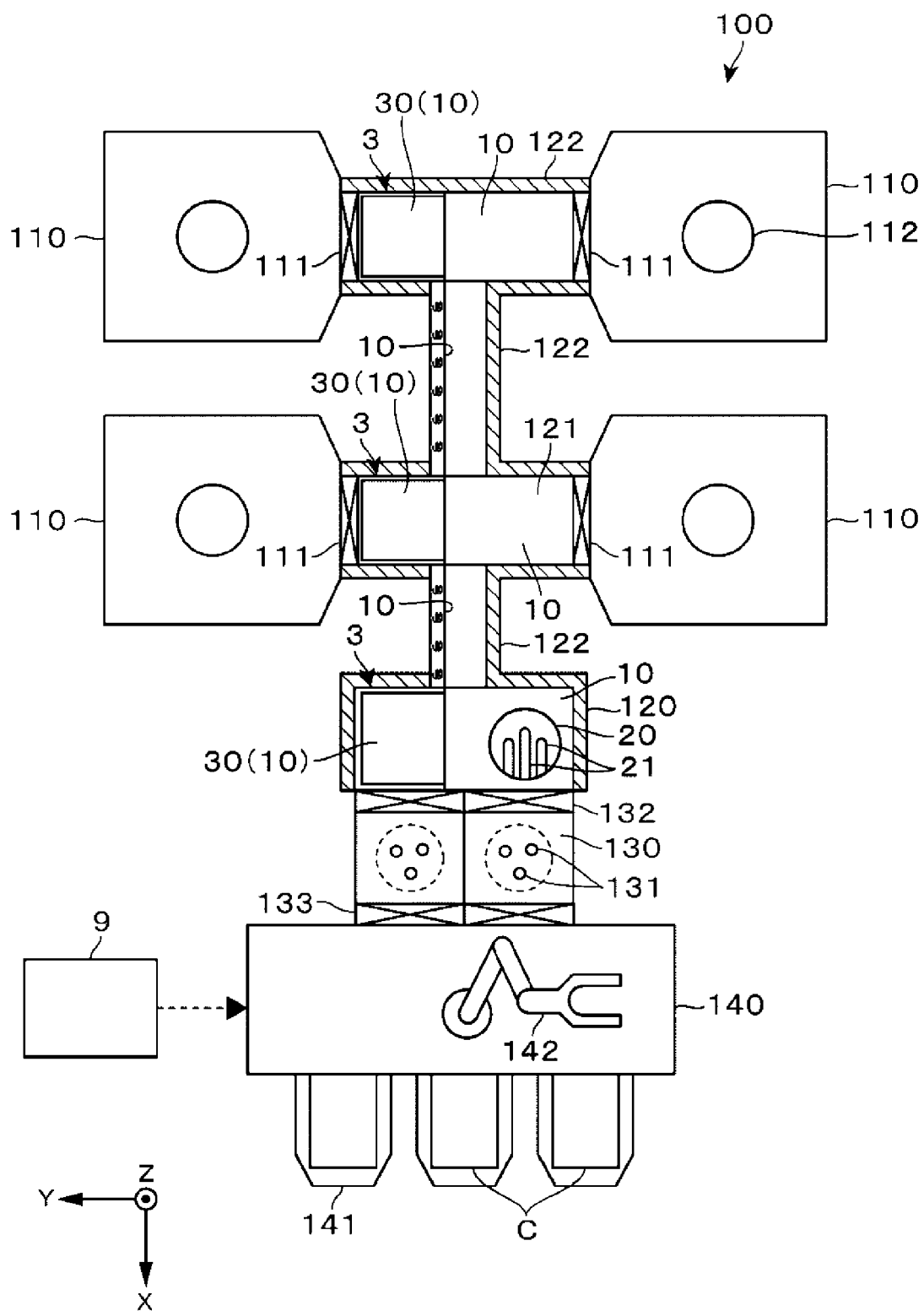
FIG. 1 is a plan view of a wafer processing system according to a first embodiment.

Hereinafter, the entire configuration of a wafer processing system 100 including an apparatus for transporting a substrate according to the first embodiment will be described with reference to FIG. 1. FIG. 1 illustrates a multi-chamber type wafer processing system 100 including a plurality of wafer processing chambers 110, which are substrate processing chambers in each of which a wafer W is processed. As illustrated in FIG. 1, the wafer processing system 100 includes a load port 141, an atmospheric transport chamber 140, a load-lock chamber 130, a vacuum transport chamber 120, and a plurality of wafer processing chambers 110. In the following description, the side at which the load port 141 is provided is referred to as a front side.

In the wafer processing system 100, the load port 141, the atmospheric transport chamber 140, and the load-lock chamber 130 are arranged in this order in the horizontal direction from the front side. In addition, a vacuum transport chamber 120 for transporting a wafer W to the wafer processing chambers 110 under a vacuum atmosphere is connected to the rear side of the load-lock chamber 130.

The load port 141 is configured as a placement stage on which a carrier C accommodating wafers W to be processed is placed, and three load ports 141 are installed side by side in the left-right direction when viewed from the front side. As the carriers C, for example, front opening unified pods (FOUPs) may be used.

The atmospheric transport chamber 140 has an atmospheric pressure (normal pressure) atmosphere and, for example, a downflow of clean air is formed therein. Inside the atmospheric transport chamber 140, a wafer transport mechanism 142 configured to transport a wafer W is provided. The wafer transport mechanism 142 in the atmosphere transport chamber 140 transports a wafer W between the carriers C and the load-lock chamber 130.

Two load-lock chambers 130 are installed side by side between the vacuum transport chamber 120 and the atmospheric transport chamber 140. In the load-lock chamber 130, a wafer W to be carried in and out is temporarily disposed. The load-lock chambers 130 each has lifting pins 131 that push up and hold a carried-in wafer W from below. Three lifting pins 131 are provided at equal intervals in the circumferential direction and are configured to be capable of being elevated. The load-lock chambers 130 are configured to be able to switch between an atmospheric pressure atmosphere and a vacuum atmosphere. The load-lock chambers 130 and the atmosphere transport chamber 140 are connected via gate valves 133.

A vacuum transport chamber 120 is connected to the rear side of the load-lock chamber 130 via gate valves 132. In addition, the plurality of wafer processing chambers 110 are connected to the vacuum transport chamber 120. Wafers W to be processed are transported between the load-lock chambers 130 and the wafer processing chambers 110 via the vacuum transport chamber 120. At this time, the wafers W are transported in a state of being placed on a transport module (a substrate transport module) 20 which will be described later.

In this example, the vacuum transport chamber 120 is provided to extend rearward from the load-lock chambers 130. Wafer processing chambers 110 are connected to the left and right sides of the vacuum transport chamber 120 so as to face each other, with the vacuum transport chamber 120 interposed therebetween. In this example, two sets of wafer processing chambers 110 facing each other are provided in the front and rear direction (a total of four wafer processing chambers). The vacuum transport chamber 120 is depressurized to a vacuum atmosphere by a vacuum exhaust mechanism (not illustrated). The vacuum transport chamber 120 corresponds to the substrate transport chamber of the present embodiment.

Figure 2:
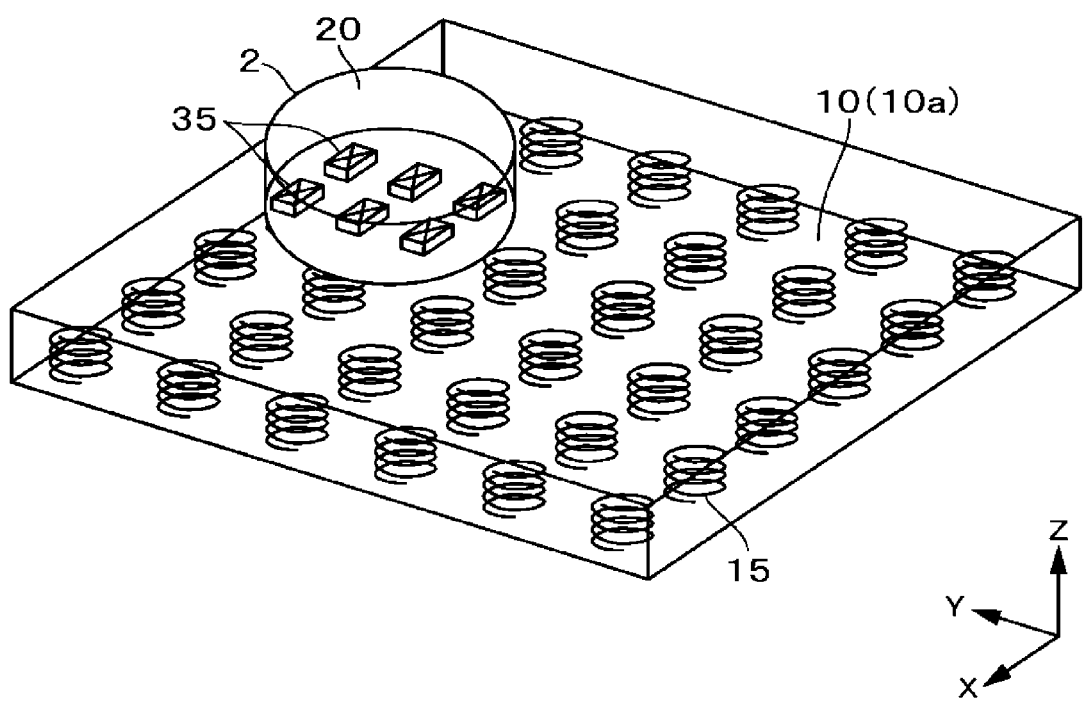
FIG. 2 is a schematic view of a tile on which a movement surface is formed and a transport module.
Figure 3:
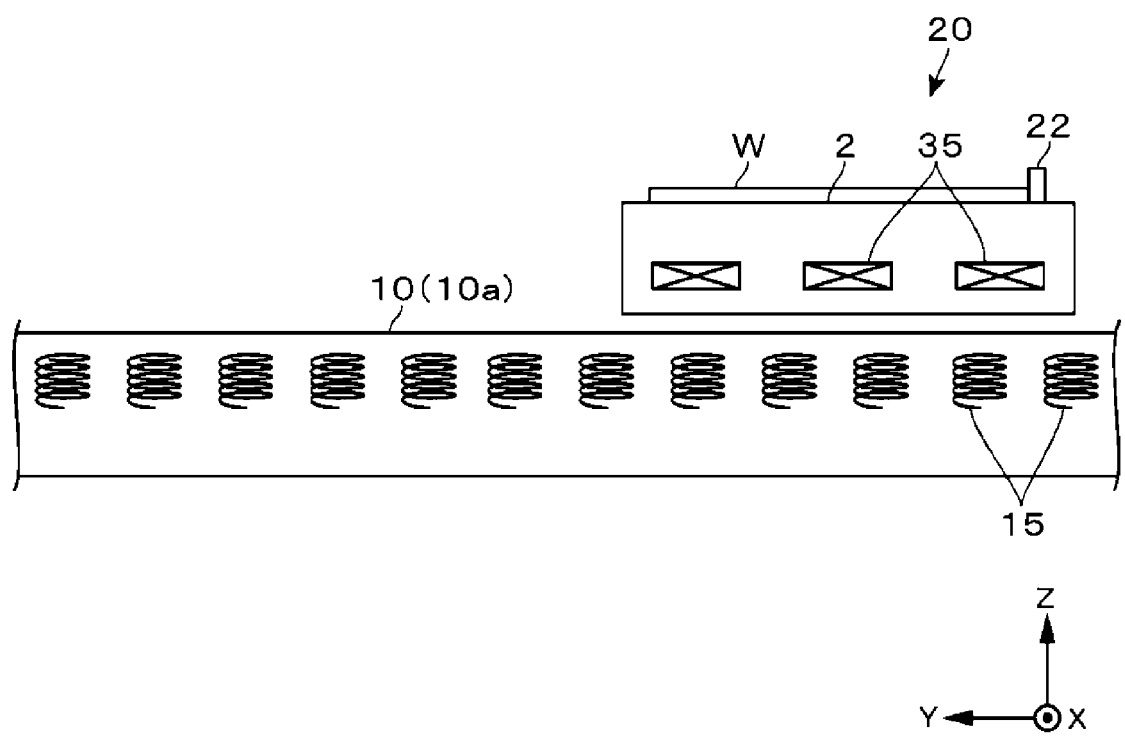
FIG. 3 is a vertical cross-sectional side view of the transport module.

Before describing the vacuum transport chamber 120, the transport module 20 for transporting a wafer W in the vacuum transport chamber 120 will be described. As illustrated in FIGS. 2 and 3, the transport module 20 includes a stage 2 on which a wafer W is placed and held. For example, the stage 2 is formed in a flat disk shape, and the top surface thereof has a diameter larger than that of the wafer W, and is configured as a placement surface for placing a wafer W to be transported.

Further, as will be described in detail later, the transport module 20 is configured to be able to hold and move a wafer W in a posture in which the placement surface is arranged in a vertical direction. For convenience of description, the above-mentioned posture is also referred to as a "standing posture." Therefore, on the top surface of the stage 2, two protrusions 22 are provided to support the wafer W from the lower side and prevent the wafer W from falling when the transport module 20 is in the standing posture. Instead of supporting the wafer W by the protrusions 22, an electrostatic chuck or a mechanical chuck may be provided on the stage 2 to support the wafer W. Further, as illustrated in FIG. 1, the transport module 20 includes three slits 21 extending from the peripheral edge of the stage 2 toward the interior of the stage 2 in order to avoid interference with the lifting pins 131 provided in the load-lock chambers 130.

As schematically illustrated in FIG. 3, the vacuum transport chamber 120, which will be described later, is provided with a plurality of tiles 10a each having a movement surface 10 for moving the transport module 20 by magnetic levitation. Further, in this example, similar tiles 10a are also provided on the bottom surface of the load-lock chambers 130. In each tile 10a, a plurality of movement surface-side coils 15 are arranged on the lower side of the movement surface 10. The movement surface-side coils 15 generate magnetic fields by being supplied with electric power from a power supply (not illustrated). From this point of view, the movement surface-side coils 15 correspond to first magnets of the present embodiment. In order to avoid complexity in the drawings, indication in parenthesis of reference numeral "10a" is omitted in the drawings other than FIGS. 2 and 3, but the movement surface 10 illustrated in each drawing is formed by the tiles 10a described above.

A plurality of permanent magnets 35 are arranged inside the transport module 20. A repulsive force or an attractive force associated with the magnetic fields generated by the movement surface-side coils 15 acts on each permanent magnet 35 according to the orientation of the magnetic poles thereof. By the action of the magnetic force which is at least one of the repulsive force or the attractive force, the transport module 20 can be in the magnetically floating state with respect to the movement surface 10. In addition, by adjusting the strength and position of the magnetic fields generated by the movement surface-side coil 15, it is possible to move the transport module 20 in a desired direction over the movement surface 10, adjust the floating amount, and adjust the orientation of the transport module 20.

The permanent magnets 35 provided in the transport module 20 correspond to the second magnets of the present embodiment. Instead of the permanent magnets in the transport module 20, the second magnets may be configured using coils that are supplied with electric power from a battery to function as electromagnets. The gap between the movement surface 10 and the transport module 20 formed by magnetic levitation is illustrated only in FIG. 3 for convenience, and the illustration of the gap is omitted in other drawings.

Next, the vacuum transport chamber 120 will be described. The vacuum transport chamber 120 includes a planar region 121 and a transport passage 122. The planar region 121 is provided with a horizontal movement surface 10 on the bottom side thereof for moving the transport module 20 in a horizontally placed posture. In addition, the transport passage 122 includes a vertical movement surface 10 for moving the transport module 20 in the standing posture.

In this example, in a region connected to the two load-lock chambers 130 provided at the front side of the vacuum transport chamber 120, one planar region 121 is disposed to face the two load-lock chambers 130. In addition, when viewed from the front side, the planar regions 121 are also arranged respectively in two regions interposed between the left and right wafer processing chambers 110. Therefore, as illustrated in FIG. 1, the planar regions 121 are arranged at three locations side by side in the front-rear direction.

The planar regions 121 arranged adjacent to each other in the front-rear direction are connected by the transport passage 122. The transport passage 122 is connected to the planar regions 121 at an approximately central position in the left-right direction when viewed from the front side. The left and right side surfaces of the transport passage 122 are vertical surfaces, respectively, and the movement surface 10 for moving the transport module 20 is formed on the left side surface among the left and right side surfaces. The transport passage 122 has a smaller width dimension in the left-right direction and a smaller floor area compared to the planar regions 121.

The vacuum transport chamber 120 is provided with angle adjusting mechanisms 3 for switching the angles of the movement surfaces 10 for the transport module 20. By switching the angles of the movement surfaces 10, the angle adjusting mechanism 3 is able to switch the posture of the transport module 20 moving along the movement surfaces 10 between the horizontally placed posture and the standing posture.

Figure 4:
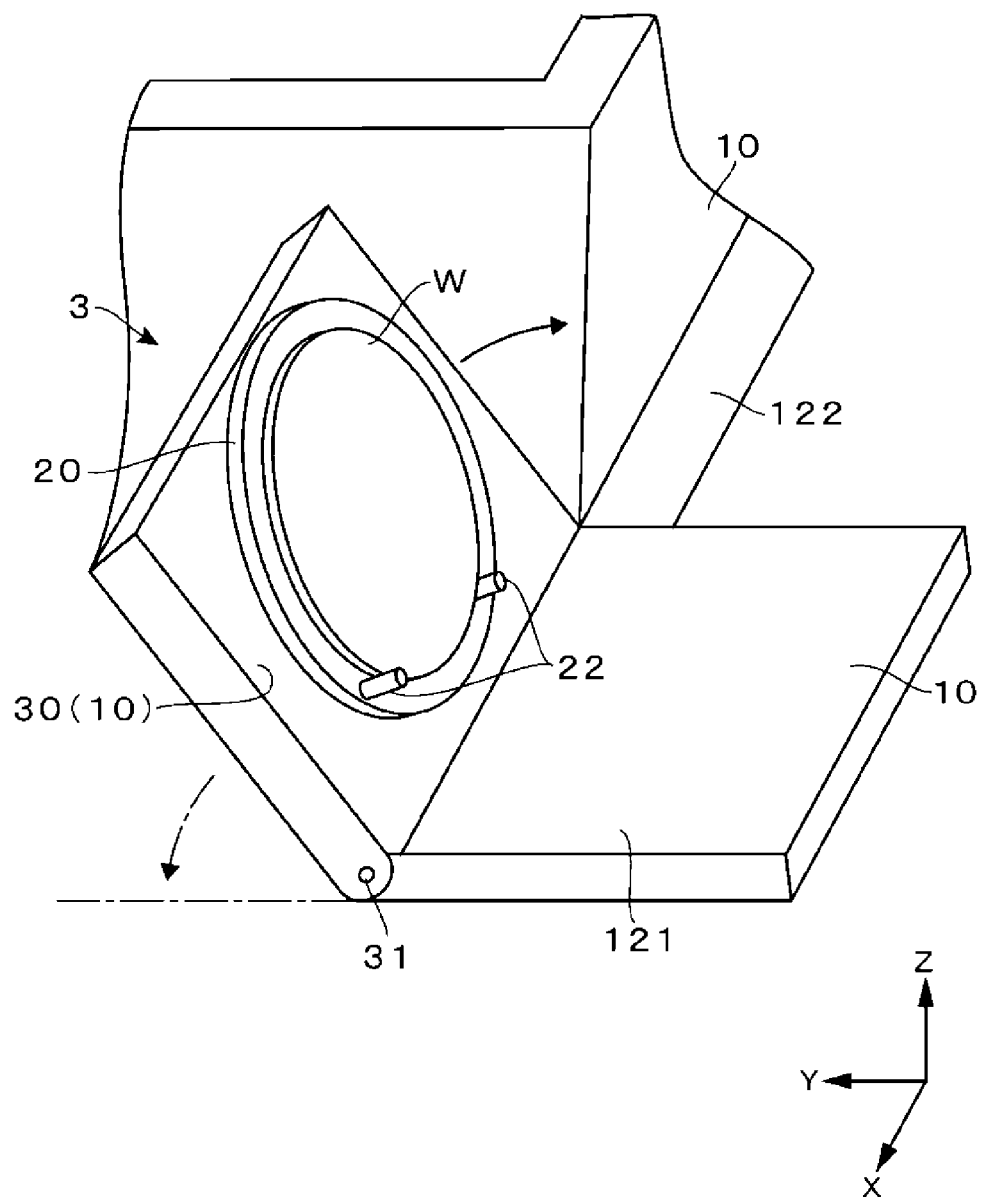
FIG. 4 is a perspective view of an angle adjusting mechanism.
Figure 5:
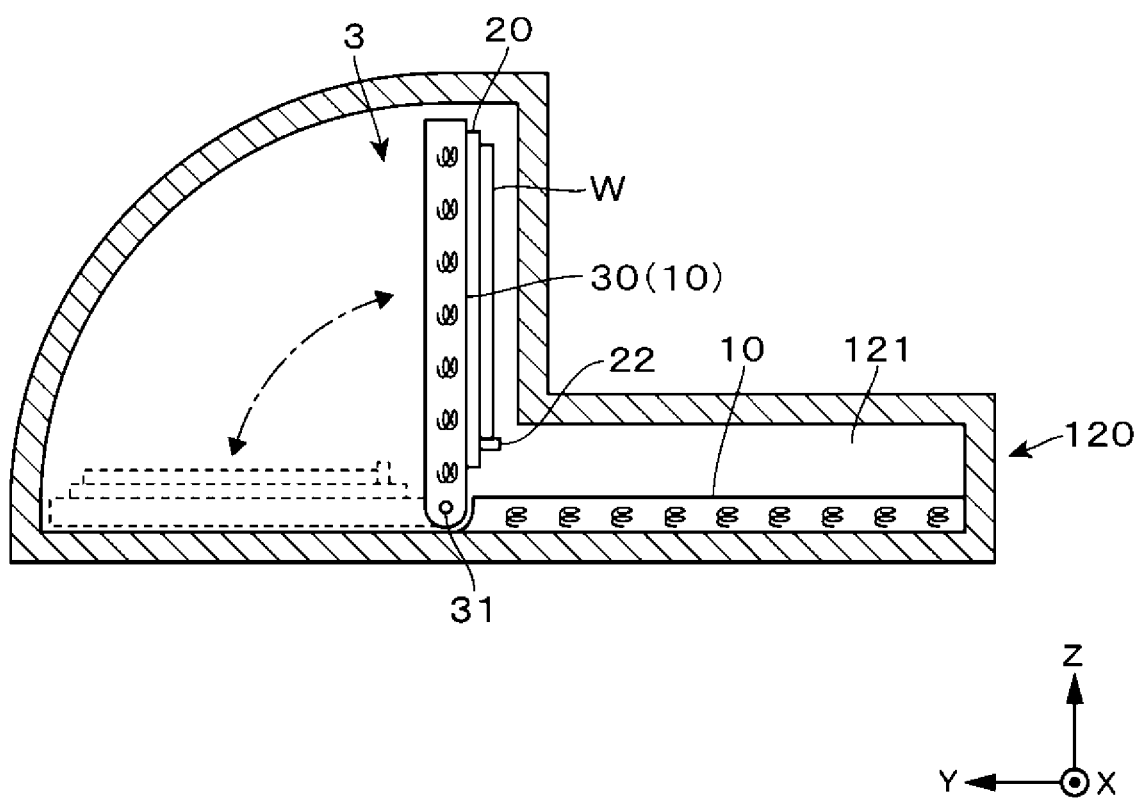
FIG. 5 is a vertical cross-sectional front view illustrating a planar region provided with the angle adjusting mechanism according to the first embodiment.

As illustrated in FIGS. 1, 4, and 5, the angle adjusting mechanisms 3 are provided in the left side regions of the planar regions 121 when viewed from the front side. The angle adjusting mechanisms 3 each includes a stage 30, one surface of which is the movement surface 10. The stage 30 is configured in a square plate shape larger than the transport module 20. A rotation shaft 31 disposed to extend in the front-rear direction is provided at the central position of the planar regions 121 and at the right end position of the stage 30 when viewed from the front side.

The stage 30 is configured to pivot around the rotation shaft 31. The stage 30 is configured such that the angle of the movement surface 10 can be switched between a first angle that makes the movement surface 10 horizontal and a second angle that makes the movement surface 10 vertical by rotating the stage 30. The arrangement position of the rotation shaft 31 is set to be aligned with the arrangement position of the transport passage 122, and when the stage 30 is made to be vertical, the movement surface 10 of the stage 30 and the movement surfaces 10 of the transport passages 122 come to be in a state of being connected (aligned) to each other.

By the angle adjusting mechanism 3 having the above-described configuration, when the stage 30 is in the first angle, the movement surface 10 of the stage 30 is connected to another movement surface 10 in the planar region 121. As a result, the transport module 20 becomes movable over the entire surfaces of the planar regions 121.

Figure 6:
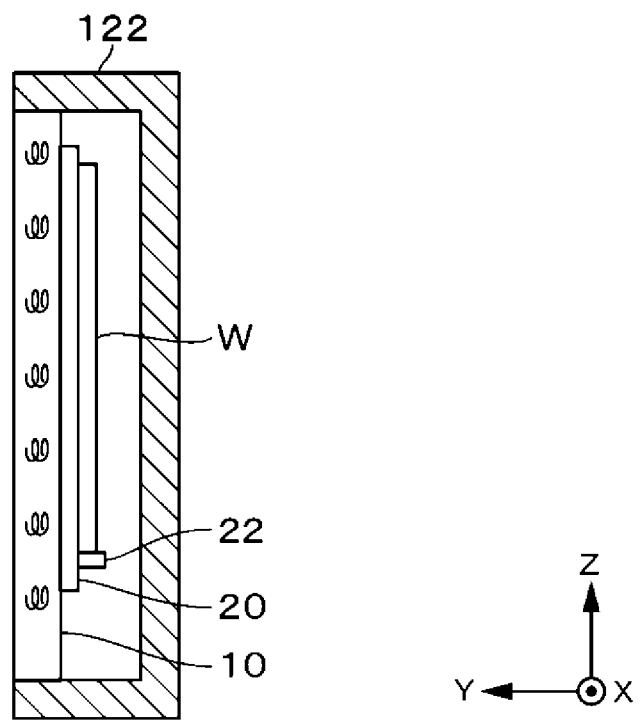
FIG. 6 is a vertical cross-sectional front view illustrating a transport passage according to the first embodiment.

In addition, as described above, when the stage 30 is in the second angle, the movement surface 10 of the stage 30 is connected to the movement surface 10 of the transport passage 122 illustrated in FIG. 6. As a result, the transport module 20 becomes movable between the stage 30 and the transport passage 122. That is, it can be said that the transport passage 122 includes the movement surface 10 at the second angle.

Each wafer processing chamber 110 is connected to the side wall of the vacuum transport chamber 120 (the planar region 121) through an opening provided with a gate valve 111. The gate valve 111 is configured to open, for example, by moving upward from the closed state of the gate, and configured to seal the interior of the wafer processing chamber 110 by a lip seal provided on the bottom surface of the gate. By using the gate valve 111 having such a configuration, it is possible to reduce the unevenness between the movement surfaces 10 so as to prevent the entry/exit of the transport module 20 to/from the wafer processing chamber 110 from being hindered.

In each wafer processing chamber 110, predetermined processing is performed on a wafer W placed on the placement stage 112 provided inside the wafer processing chamber 110 in a state of being depressurized to a vacuum atmosphere by a vacuum exhaust mechanism (not illustrated). Examples of the processing to be performed on the wafer W may include an etching process, a film forming process, a cleaning process, an ashing process, and the like. The placement stage 112 is provided with, for example, a heater (not illustrated) that heats the wafer W to a predetermined temperature. When the processing performed on the wafer W uses a processing gas, the wafer processing chamber 110 is provided with a processing gas supply part (not illustrated) configured with a shower head or the like. The wafer processing chamber 110 corresponds to the substrate processing chamber of the present embodiment.

In addition, the wafer processing chamber 110 is provided with a wafer W delivery mechanism (not illustrated) for delivering a wafer W to and from the transport module 20 in the vacuum transport chamber 120. Examples of the delivery mechanism may include lifting pins protruding and retracting through the above-described slits 21 provided in the transport module 20 to push up the wafer W placed on the transport module 20 from the bottom side to move the wafer W upward and downward. Then, the wafer W can be delivered to the placement stage 112 provided in the wafer processing chamber 110 by lowering the lifting pins.

Returning to FIG. 1, the wafer processing system 100 having the above-described configuration includes a controller 9 that controls each movement surface-side coil 15, the wafer processing chamber 110, or the like. The controller 9 is configured with a computer including a CPU and a storage part, and controls each part of the wafer processing system 100 or the like. A program in which a group of steps (instructions) for controlling the operations of the transport module 20 or the wafer processing chambers 110 is included is recorded in the storage part. The program is stored in a non-transitory computer-readable storage medium such as a hard disk, a compact disk, a magnetic optical disk, or a memory card, from which the program is installed in the computer.

Next, an example of the operation of the wafer processing system 100 will be described. First, when the carrier C accommodating wafers W to be processed is placed in the load port 141, a wafer W is taken out from the carrier C by the wafer transport mechanism 142 in the atmospheric transport chamber 140.

Subsequently, when the gate valve 133 is opened and the wafer transport mechanism 142 enters the load-lock chamber 130, the lifting pins 131 push up and receive the wafer W. Here, for example, the first wafer W is carried into the right load-lock chamber 130 when viewed from the front side. Thereafter, when the wafer transport mechanism 142 retracts from the load-lock chamber 130, the gate valve 133 is closed. In addition, the interior of the load-lock chamber 130 is switched from the atmospheric atmosphere to the vacuum atmosphere. Subsequently, the second wafer W is transported to the left load-lock chamber 130 when viewed from the front side through the same procedure.

When the interior of the load-lock chamber 130 becomes a vacuum atmosphere, the gate valve 132 is opened. At this time, in the vacuum transport chamber 120, the transport module 20 is in a stand-by state facing the load-lock chamber 130. Then, using the magnetic fields generated by the movement surface-side coils 15 provided on the tiles 10a, the transport module 20 is raised by magnetic levitation using a repulsive force.

Subsequently, the transport of the wafer W from the load-lock chamber 130 to each wafer processing chamber 110 will be described. Before initiating the transport of the wafer W, the stage 30 in each angle adjusting mechanism 3 sets the movement surface 10 in a horizontal state (the first angle).

First, the transport module 20 is caused to enter the load-lock chamber 130 and is located below the wafer W supported by the lifting pins 131. In addition, the wafer W is placed on the stage 2 by lowering the lifting pins 131 and delivering the wafer W to the transport module 20.

Figure 7:
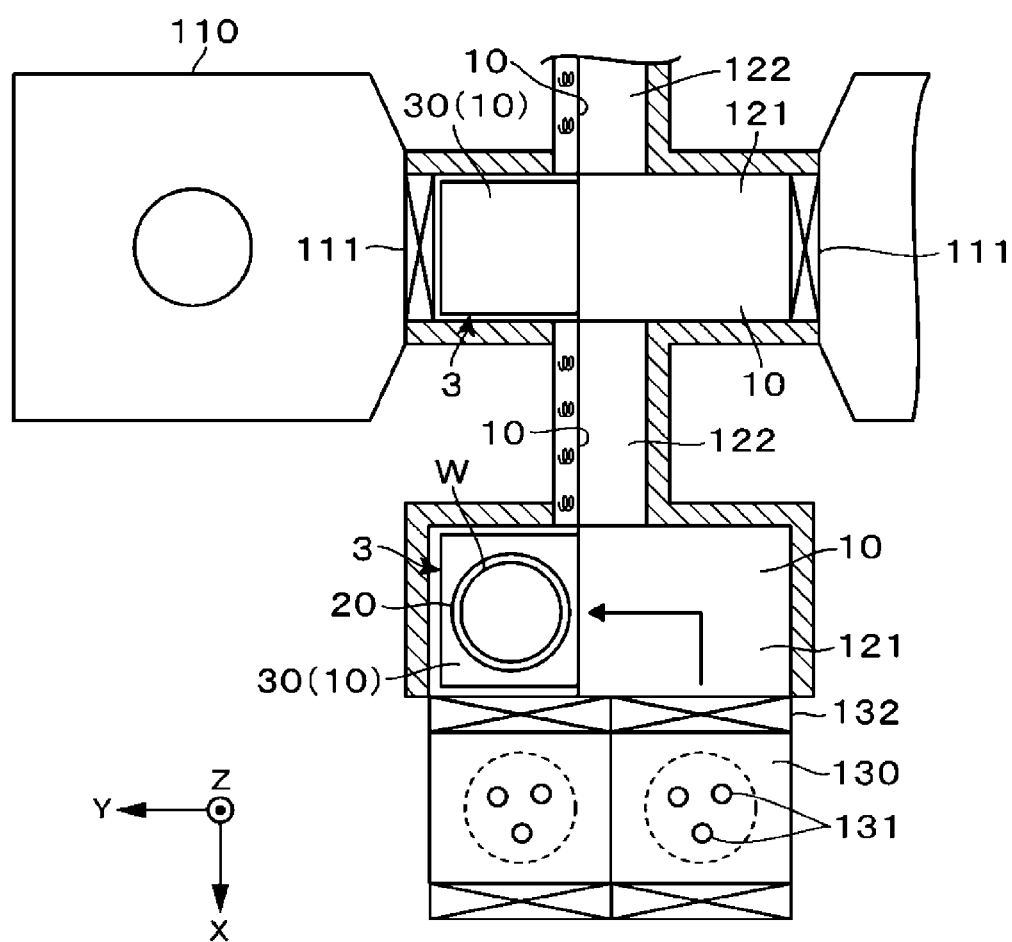
FIG. 7 is a first operation diagram illustrating an operation example of the transport module.

Next, as illustrated in FIG. 7, the transport module 20 holding the wafer W is retracted from the load-lock chamber 130 and moved to the left side in the planar region 121 when viewed from the front side. As described above, when the movement surface 10 of the stage 30 is in a horizontal state, the movement surface 10 of the stage 30 is connected to another movement surface 10 in the planar region 121. Therefore, as illustrated in FIG. 7, the transport module 20 is movable to the movement surface 10 of the stage 30. At this time, the transport module 20 stops in a state in which the protrusions 22 face the rotation shaft 31 as illustrated in FIG. 4.

Figure 8:
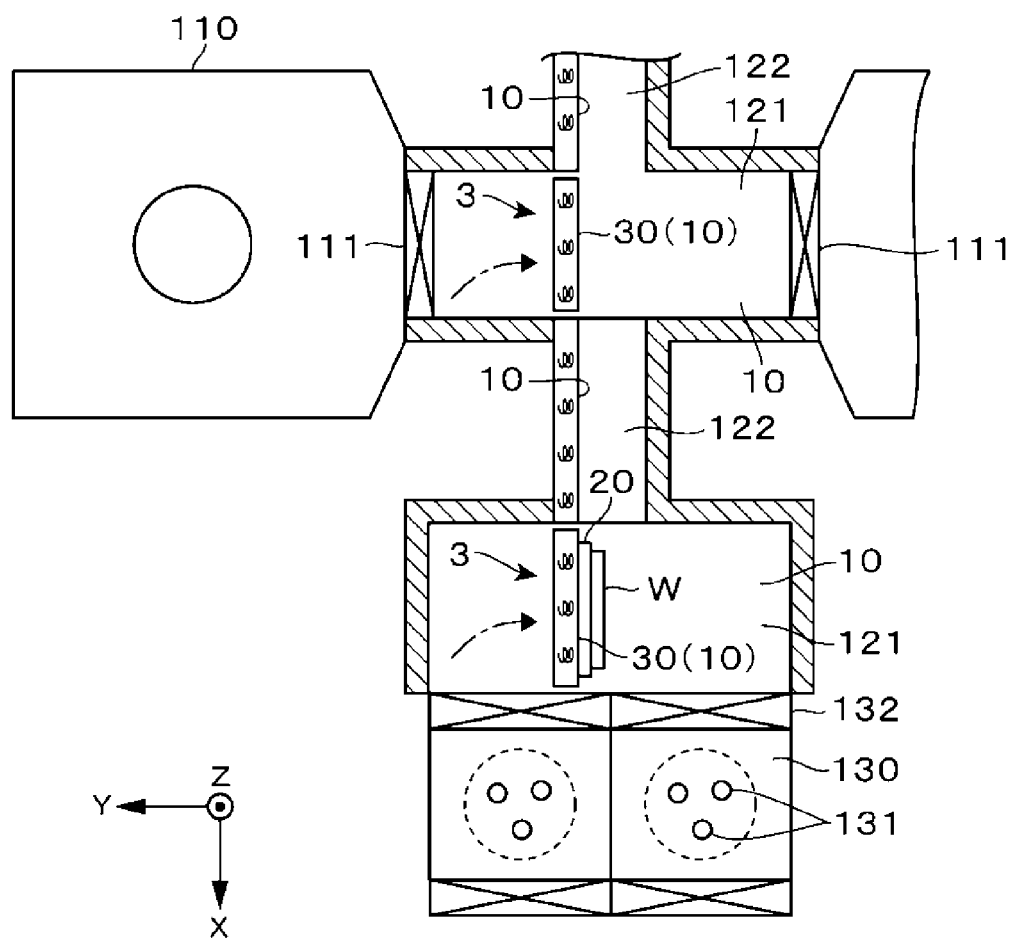
FIG. 8 is a second operation diagram illustrating an operation example of the transport module.

Subsequently, the angle of the stage 30 is adjusted by the angle adjusting mechanism 3, and the movement surface 10 is switched to the vertical state (the second angle). At this time, as illustrated in FIG. 8, another angle adjusting mechanism 3 provided at a side of the wafer processing chamber 110 also adjusts the angle of the stage 30 to switch the movement surface 10 into the vertical state. As a result, the movement surface 10 of the stage 30 at the wafer processing chamber 110 side is also connected to the movement surface 10 of the transport passage 122.

Figure 9:
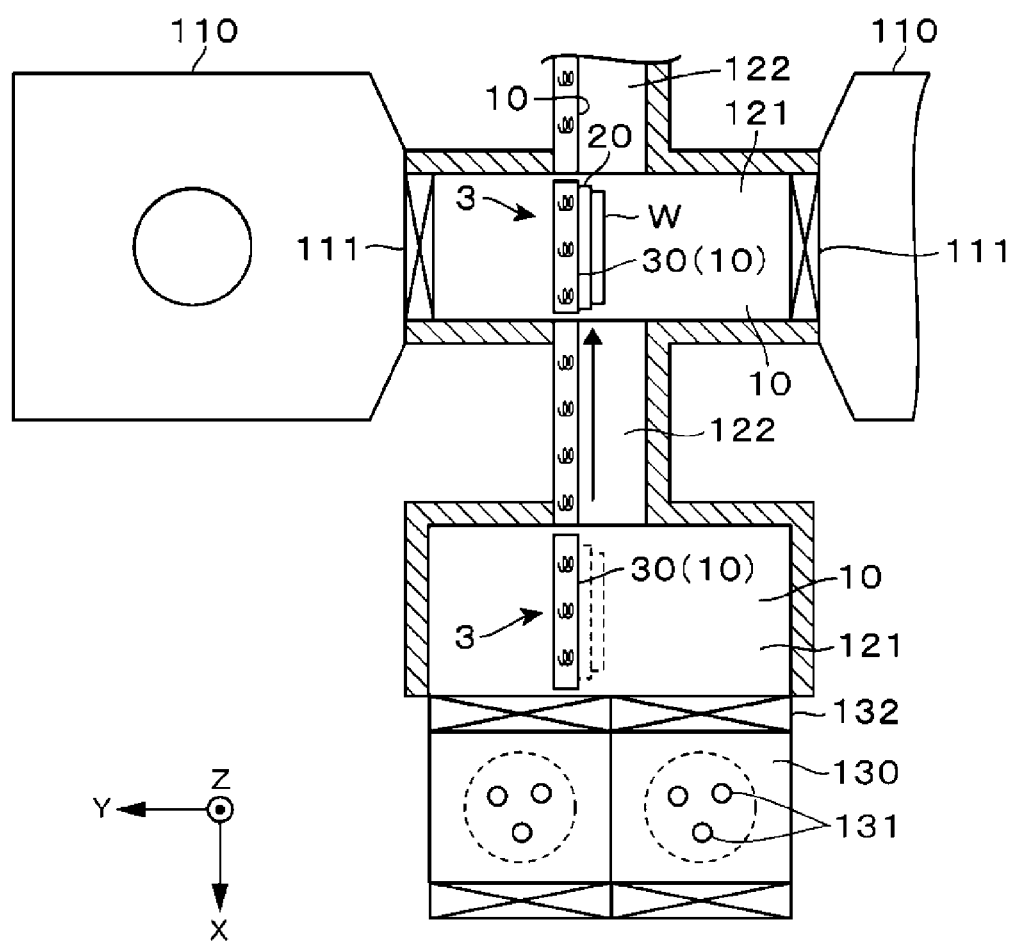
FIG. 9 is a third operation diagram illustrating an operation example of the transport module.

At this time, the transport module 20 is in the standing posture, but the protrusions 22 are provided on the rotation shaft 31 side when viewed from the wafer W. The protrusions 22 are located on the lower side of the wafer W in the standing state, and thus the wafer W is suppressed from falling. There is also an effect of alignment since the position of the wafer W is regulated by the protrusions 22. Then, the transport module 20 of the stage 30 passes through the movement surface 10 of the transport passage 122 and moves to, for example, the movement surface 10 of the stage 30 of the angle adjusting mechanism 3 provided in the next planar region 121 (FIG. 9).

Figure 10:
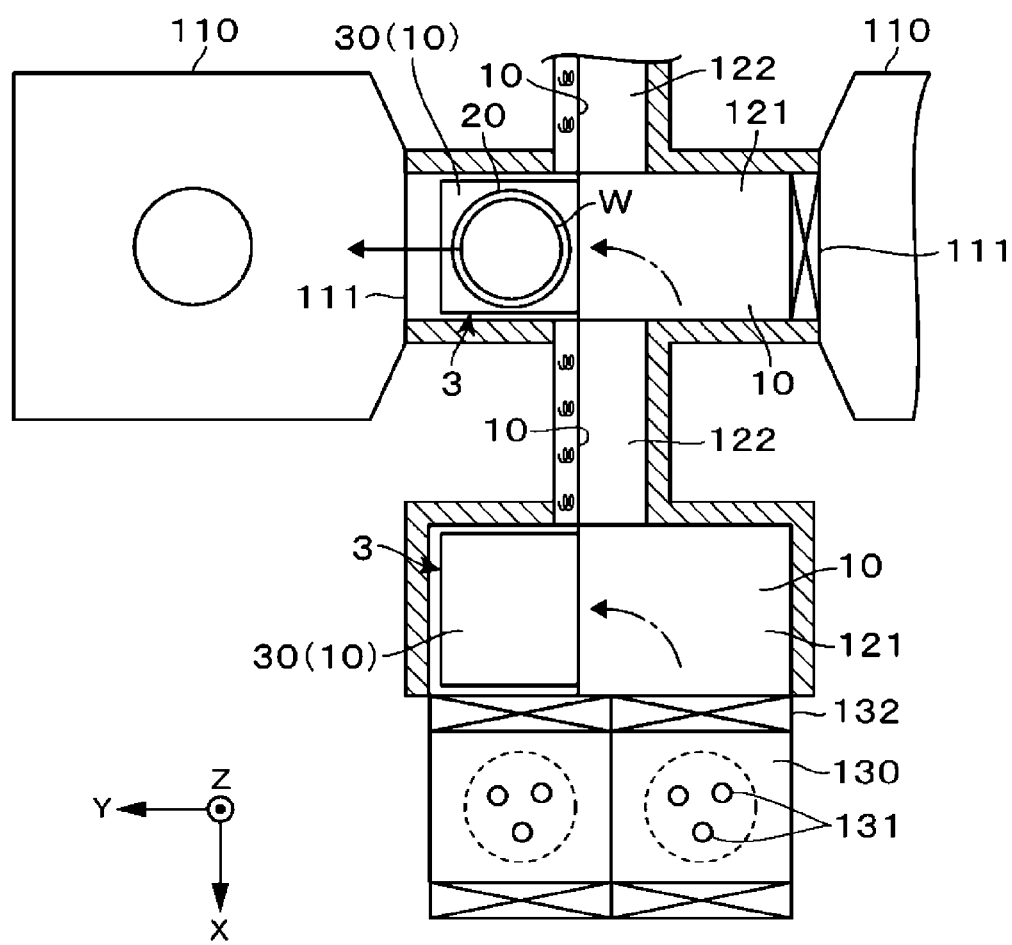
FIG. 10 is a fourth operation diagram illustrating an operation example of the transport module.

Next, the movement surface 10 of the stage 30 on which the transport module 20 is located is switched into the horizontal state. As a result, as illustrated in FIG. 10, the transport module 20 is in the horizontal posture, and the movement surface 10 of the stage 30 is connected to another movement surface 10 in the planar region 121. In other words, the angle adjusting mechanism 3 provided in the planar region 121 on the wafer processing chamber 110 side switches the movement surface 10 for the transport module 20 which has come by moving via the transport passage 122 from the second angle to the first angle. Then, for example, the gate valve 111 of the wafer processing chamber 110 which is the transport destination is opened, and the wafer W held by the transport module 20 is carried into the wafer processing chamber.

When the carry-in of the wafer W into each wafer processing chamber 110 is completed by each operation described above, the transport module 20 is caused to exit from the wafer processing chamber 110, and the gate valve 111 is closed. Subsequently, the wafer W is sequentially heated by the placement stage 112 to raise the temperature to a preset temperature, and the processing gas is supplied from the processing gas supply part into the wafer processing chamber 110. In this way, desired processing is performed on the wafer W.

After the processing of the wafer W for a preset period in this way, the heating of the wafer W is stopped and the supply of the processing gas is stopped. Thereafter, the wafer W is transported in the reverse procedure of the carry-in procedure, and the wafer W is returned from the wafer processing chamber 110 to the load-lock chamber 130. In addition, after switching the atmosphere of the load-lock chamber 130 to a normal pressure atmosphere, the wafer W in the load-lock chamber 130 is taken out by the wafer transport mechanism 142 in the atmosphere transport chamber 140 and returned to the predetermined carrier C.

Summarizing the above operations, when the transport module 20 on which the wafer W is placed exits from the load-lock chamber 130, the movement surface 10 is moved using the angle adjusting mechanism 3 to change the posture thereof from the horizontally placed posture to the standing posture. Then, the transport module 20 moves to the planar region 121 on the wafer processing chamber 110 side through the transport passage 122 in the standing posture. Thereafter, the transport module 20 changes the posture thereof to the horizontally placed posture by the angle adjusting mechanism 3 provided in the planar region 121. Then, the transport module 20 moves over the movement surface 10 at the first angle in the horizontally placed posture, enters the wafer processing chamber 110, and delivers the wafer W.

By moving the transport module 20 along the vertical movement surface 10 in this way, the wafer W can be transported using the transport passage 122 having a small floor area. Therefore, the floor area of the entire vacuum transport chamber 120 can be reduced, and the enlargement of the apparatus can be avoided.

In the wafer processing system 100, a pump for evacuating the interior of the wafer processing chamber 110, a tank for a processing liquid used in processing the wafer W, and the like are installed side by side. For example, when such a pump, tank, or the like is to be installed above the wafer processing chamber 110, the wafer processing system 100 may become multi-floored. Meanwhile, in the wafer processing system 100 according to the present disclosure, since a pump, a tank, or the like can be disposed in a region on the transport passage 122 side, it is possible to suppress such multi-flooring of the wafer processing system 1.

In addition, for example, the wafer W placed on the placement stage 112 may be temperature-controlled by a temperature control mechanism such as a chiller, but considering the thermal efficiency, the temperature control mechanism is preferably located as close as possible to the place at which heat treatment is performed. In the wafer processing system 100 according to the present disclosure, since there are many options for the installation layout of ancillary equipment, such as providing a temperature control mechanism near a place at which heat treatment is performed by using a lateral side of the transport passage 122, it is possible to select a layout suitable for a desired process.

The angle (second angle) of the movement surface 10 of the transport passage 122 is not limited to the vertical state, and may be, for example, 45 degrees or more and 90 degrees or less. By setting the side surface of the transport passage 122 to an inclined movement surface 10 in this way, the floor area of the vacuum transport chamber 120 can be reduced. In addition, the angle adjusting mechanism 3 may be provided in the load-lock chamber 130.

In addition, the number and layout of wafer processing chambers 110 connected to the vacuum transport chamber 120 are not limited to the example illustrated in FIG. 1. The number of the wafer processing chambers 110 may be increased or decreased as needed. For example, the case in which only one wafer processing chamber 110 is provided for the vacuum transport chamber 120 is also included within the technical scope of the present disclosure.

Regarding the arrangement of the vacuum transport chamber 120 as well, the vacuum transport chamber 120 is not limited to the case in which the long sides of the vacuum transport chamber 120 are arranged in the front-rear direction as illustrated in FIG. 1. For example, the vacuum transport chamber 120 may be arranged with the long sides being oriented in the left-right direction when viewed from the side of the load ports 141. In addition, regarding the planar shape of the vacuum transport chamber 120 as well, various shapes may be adopted depending on the shape of the area in which the wafer processing system 100 is arranged. The transport passage 122 may be disposed to form each side of, for example, a substantially square or a polygon of a pentagon or more, a circle, or an ellipse.

In addition, the substrate transport chamber in which wafers W are transported to the wafer processing chambers 110 using the transport module 20 is not limited to the case in which the substrate transport chamber is configured with the vacuum transport chamber 120 having therein a vacuum atmosphere. The apparatus of the present disclosure is also be applicable to a wafer processing system including wafer processing chambers 110 provided on a lateral side of a substrate transport chamber having therein an atmospheric atmosphere. In this case, it is not an essential requirement to provide the load-lock chambers 130 for the wafer processing system, and a wafer W taken out from a carrier C to the atmospheric transport chamber 140 may be directly carried into the substrate transport chamber.

Second Embodiment

Figure 11:
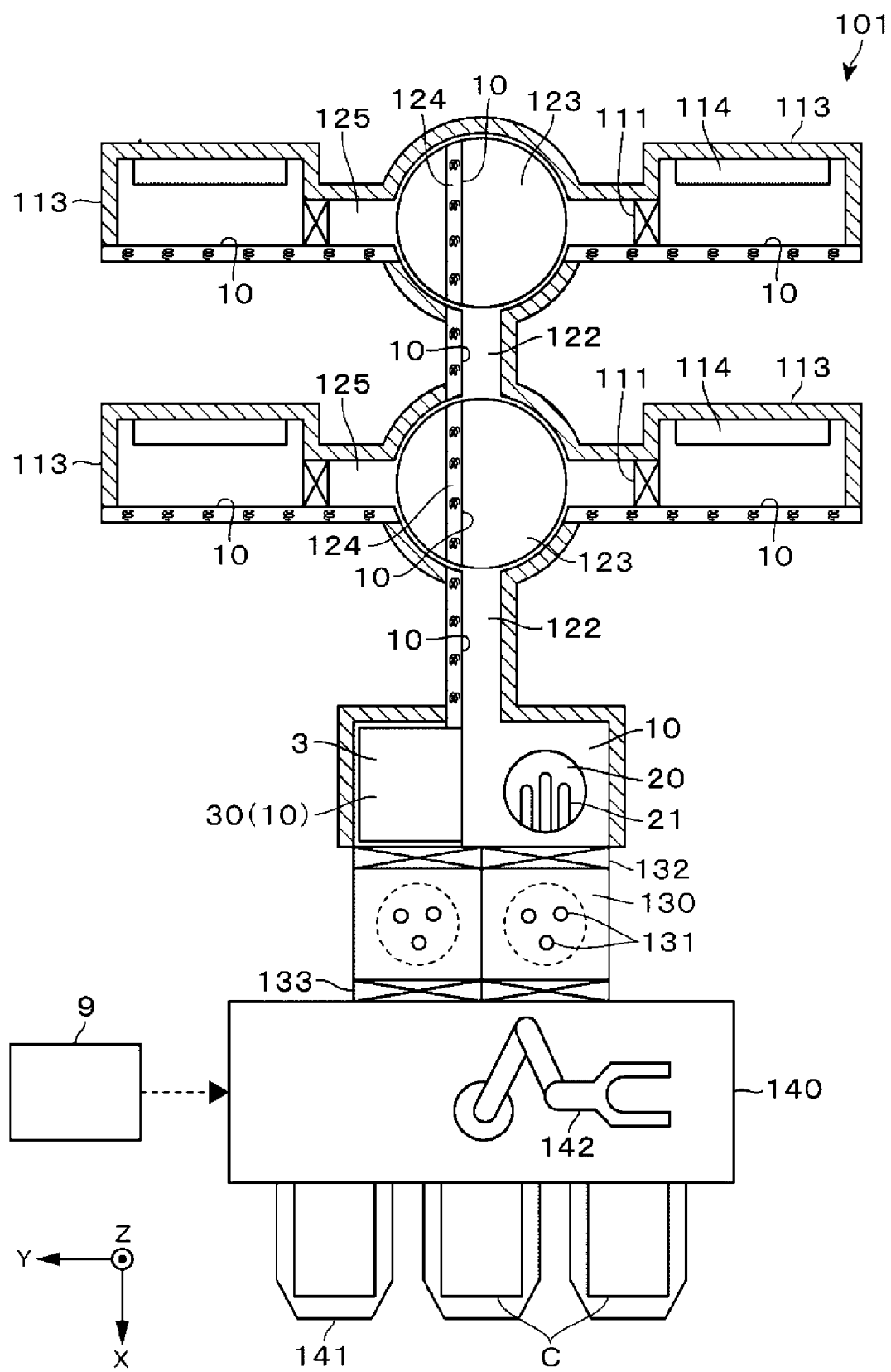
FIG. 11 is a plan view of a wafer processing system according to a second embodiment.

In the wafer processing system, the transport module 20 may be carried into the wafer processing chambers by moving along the movement surface 10 in a state of the standing posture. For example, FIG. 11 illustrates a wafer processing system 101 configured such that the transport module 20 moves along the vertical movement surfaces 10 and enters the wafer processing chambers 113. This wafer processing system 101 is different from the vacuum transport chamber 120 illustrated in FIG. 1 in that the planar region 121 is provided only at the foremost side which is disposed to face the load-lock chambers 130. The transport module 20 is made to take the standing posture in this planar region 121 and is moved along the vertical movement surface 10 through the transport passage 122 to enter a wafer processing chamber 113.

In this example, a rotary stage 123 for switching the moving direction of the transport module 20 is provided at the rear side of the transport passage 122. Another transport passage 122 is further provided in the rear side of the rotary stage 123, and another rotary stage 123 is provided at the rear side of the end of the transport passage 122. Each rotary stage 123 is configured to rotate about a vertical axis, and a vertical surface 124 including a movement surface 10 which can be connected to the movement surface 10 of each transport passage 122 is provided on the rotary stage 123.

Then, on the left and right sides of each rotary stage 123, the wafer processing chambers 113 are connected via passages 125 each provided with a movement surface 10 which can be connected to the movement surface 10 of the vertical surface 124 when the rotary stage 123 is rotated 90 degrees counterclockwise when viewed from above. Reference numeral 111 in FIG. 11 indicates gate valves.

Each wafer processing chamber 113 includes, for example, a vertical movement surface 10 which can be connected to the movement surface 10 of the passage 125. The wafer processing chamber 113 in this example is provided with an ion implantation part 114 that horizontally emits ions toward the wafer W supported by the transport module 20 that has entered the wafer processing chamber 113 to perform ion implantation. This wafer processing chamber 113 is configured to emit ions toward the wafer W supported by the transport module 20.

The movement surface 10 of this wafer processing chamber 113 may be provided with a support that supports the transport module 20 from below in order to align the transport module 20. The wafer processing chamber 113 may be provided with a delivery mechanism that delivers the wafer W from the transport module 20 that has come by moving along the vertical movement surface 10 to a wafer holding part in the wafer processing chamber 113.

Figure 12:
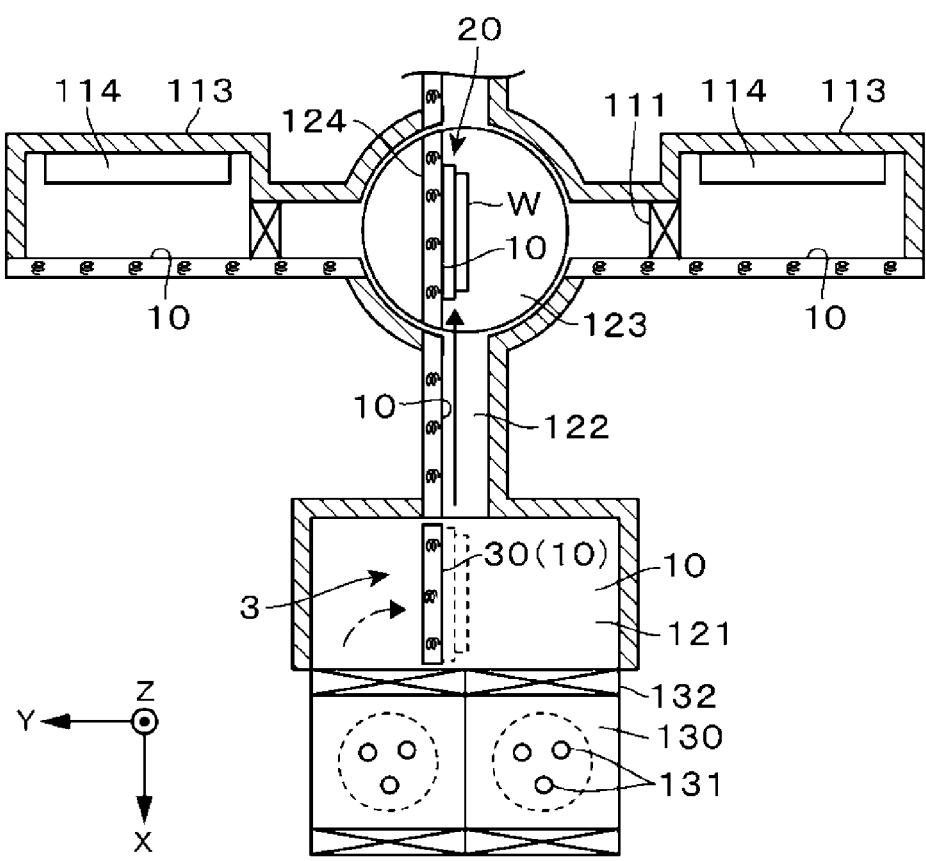
FIG. 12 is a first operation diagram illustrating an operation example of a transport module according to the second embodiment.
Figure 13:
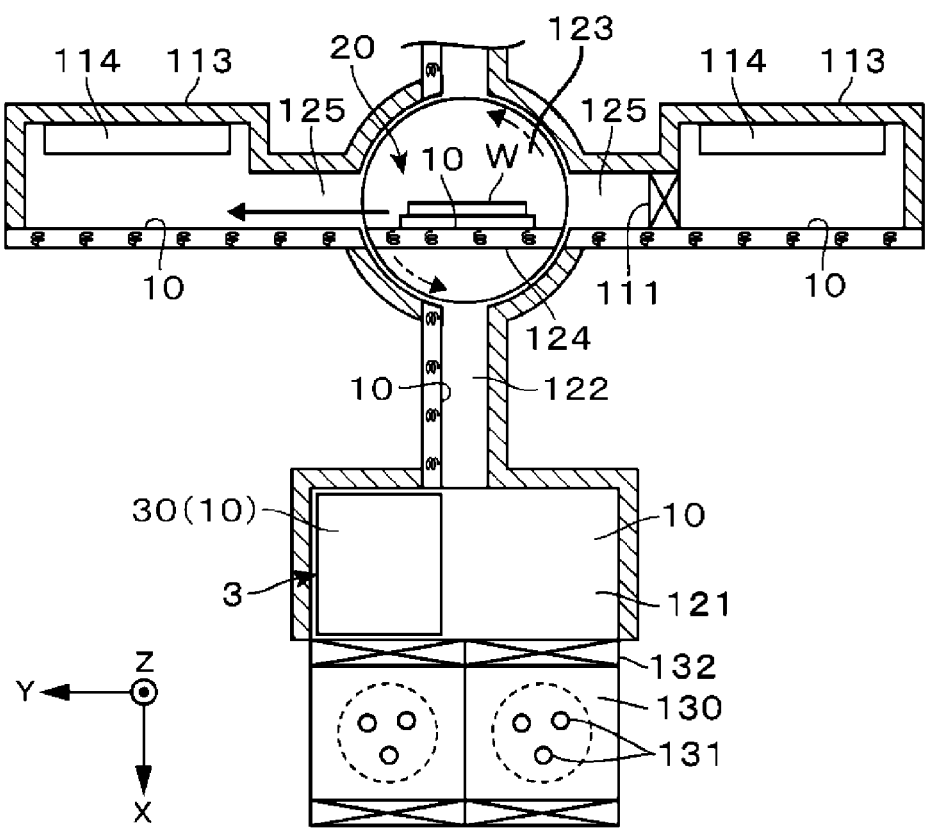
FIG. 13 is a second operation diagram illustrating an operation example of the transport module according to the second embodiment.

In the above-described wafer processing system 101, the transport module 20 holding the wafer W is moved from the load-lock chamber 130 into the vacuum transport chamber 120 and moved to the space above the stage 30 in the same manner as in the first embodiment. In addition, after switching the movement surface 10 into the vertical state, the transport module 20 is moved to, for example, the front rotary stage 123 (FIG. 12). Next, the rotary stage 123 is rotated 90 degrees counterclockwise as illustrated in FIG. 13. In addition, the gate valve 111 of the wafer processing chamber 113 which is the transport destination is opened, and the transport module 20 in the standing posture is moved along the movement surface 10 at the second angle to enter the wafer processing chamber 113 on the left side. Subsequently, the gate valve 111 is closed and the wafer W is processed. In the above-described wafer processing system 101, since it is also possible to transport wafers W through the transport passages 122 and the passages 125 having a small floor area and thus to reduce the floor area of the vacuum transport chamber 120, the same effect as the first embodiment can be obtained.

Third Embodiment

Figure 14:
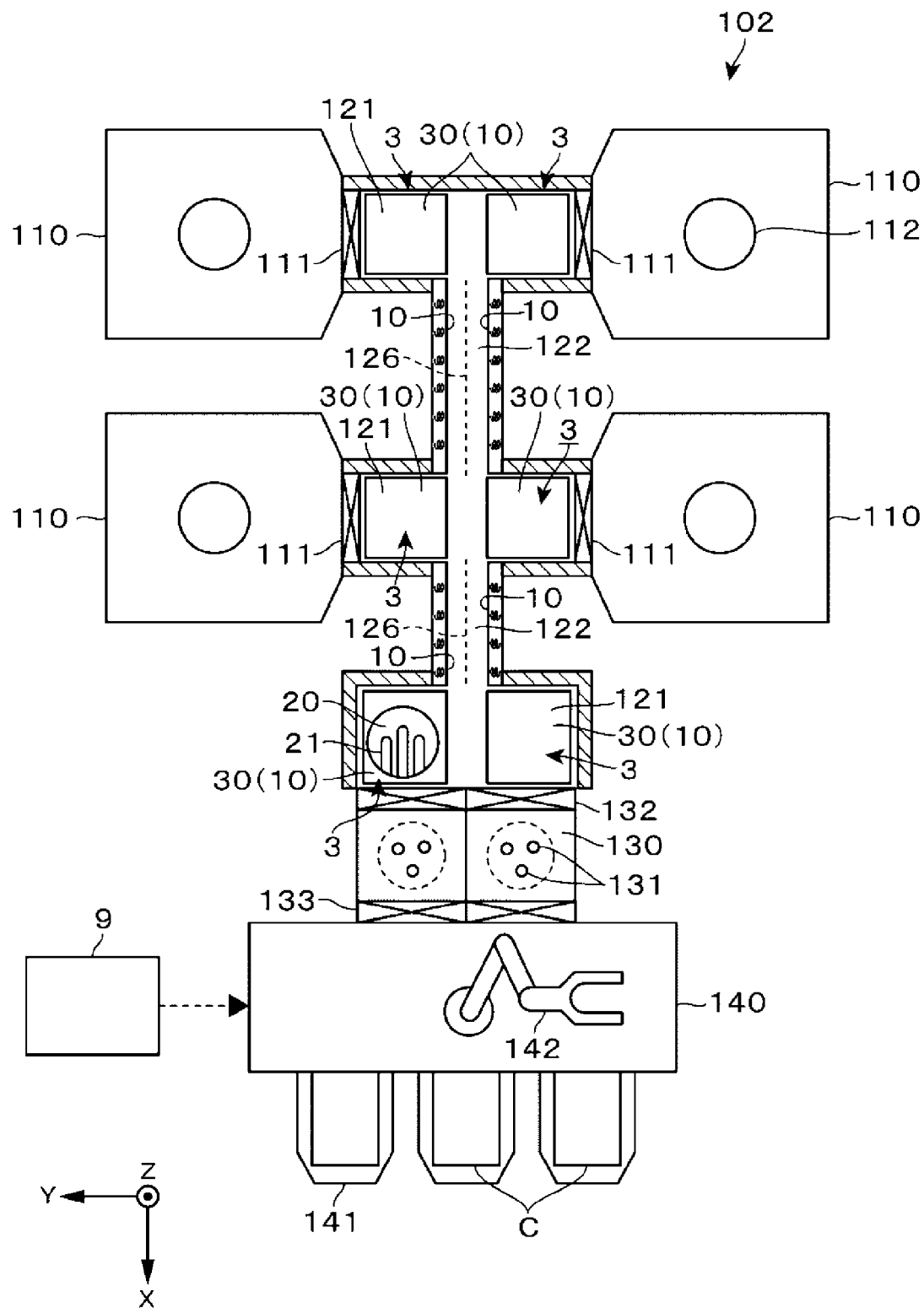
FIG. 14 is a plan view of a wafer processing system according to a third embodiment.
Figure 15:
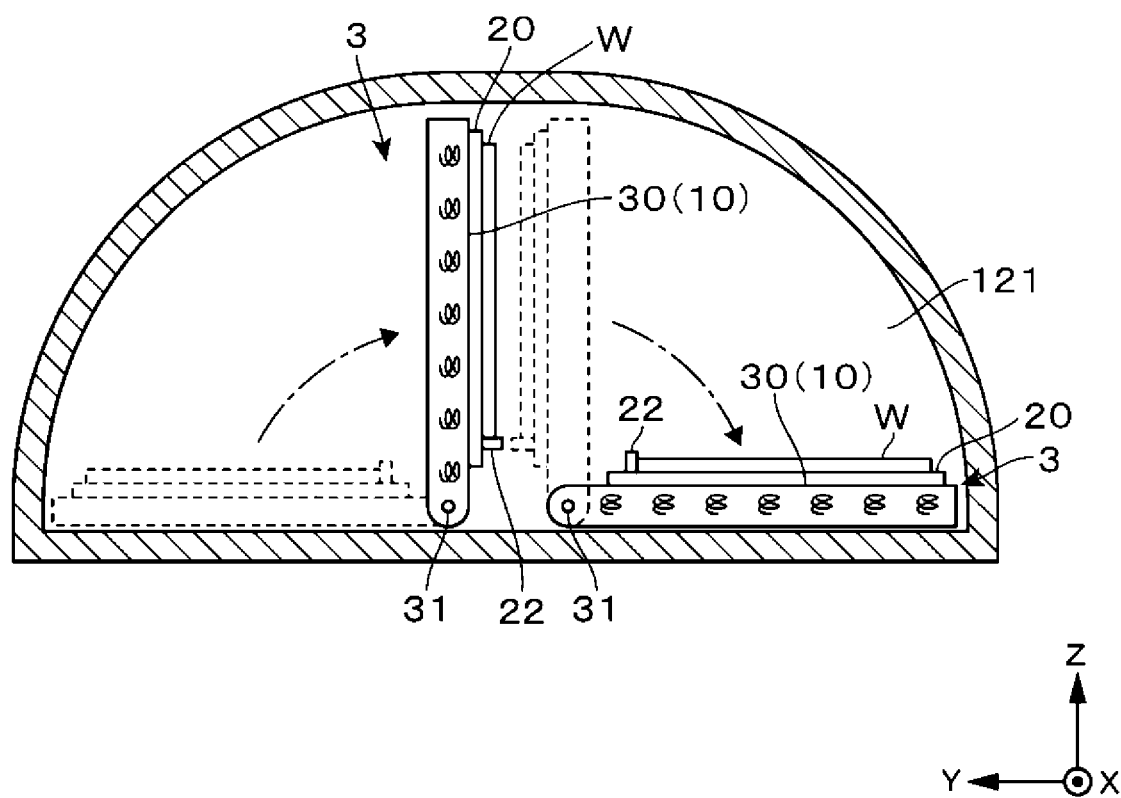
FIG. 15 is a vertical cross-sectional front view illustrating a region in which an angle adjusting mechanism according to the third embodiment is provided.
Figure 16:
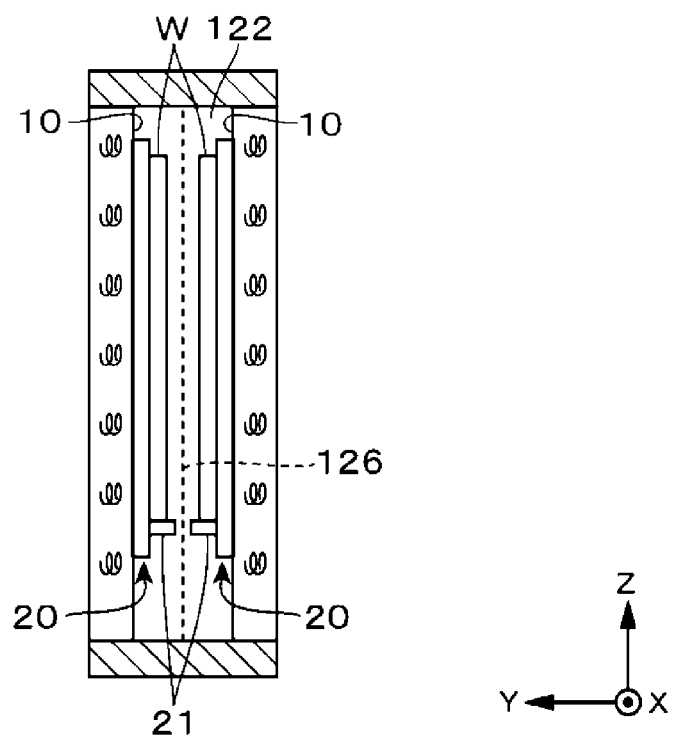
FIG. 16 is a vertical cross-sectional front view illustrating a transport passage according to a third embodiment.

In addition, two opposite side surfaces of the transport passage 122 may function as movement surfaces 10 for the transport module 20, so that the two transport modules 20 can pass through the transport passage 122. FIGS. 14 to 16 illustrate an example of such a wafer processing system 102.

In this example, the left and right side surfaces of the transport passage 122 are configured as vertical movement surfaces 10 (FIG. 14).

In addition, in the planar region 121, in addition to the angle adjusting mechanism 3 illustrated in the first embodiment, another angle adjusting mechanism 3 is also provided in a region on the right side of the planar region 121 when viewed from the front side. These angle adjusting mechanisms 3 are symmetrically configured when viewed from the front side (FIG. 15). Although there is a gap between the left and right angle adjusting mechanisms 3, the gap has a size which does not hinder the movement of the transport modules 20 between the left and right angle adjusting mechanisms 3. Furthermore, a horizontal movement surface 10 may be provided to fill the gap.

With the above-described configuration, when the movement surfaces 10 of the left and right stages 30 are in the horizontal state, the movement surfaces 10 in the planar region 121 are connected to each other. When the movement surface 10 of the right stage 30 is in the vertical state, the movement surface 10 is in a state of being connected to the movement surfaces 10 at the right side of the transport passage 122. When the movement surface 10 of the left stage 30 is in the vertical state, the movement surface 10 is in a state of being connected to the movement surfaces 10 on the left side of the transport passage 122.

The transport passage 122 is formed to have a width that allows the two transport modules 20 holding wafers W to pass by each other (FIG. 16). Therefore, two movement surfaces 10 disposed to face each other are arranged with a gap therebetween through which the transport modules 20 can pass by each other. Further, at the central position in the left-right direction of the transport passage 122, a dielectric partition member 126, which is made of a dielectric and partitions the space through which the transport modules 20 holding wafers W move in the transport passage 122, into the left space and the right space is provided.

With this configuration, the transport modules 20 can pass by each other through the transport passage 122 while suppressing the widening of the transport passage 122. Therefore, since it is possible to allow a plurality of transport modules 20 to pass through each transport passage 122 at the same time, the throughput of the apparatus is improved. In addition, by installing the dielectric partition member 126 to partition the transport passage 122 to the left space and the right space, it is possible to prevent magnetic forces of respective transport modules 20 from interfering with each other when the two transport modules 20 pass by each other.

In addition, unlike the example described with reference to FIGS. 14 to 16, a wafer processing system including two transport passages 122 may have a configuration in which movement surfaces 10 are formed on opposite surfaces of a common vertical wall and the transport modules 20 are moved along the movement surfaces, respectively.

According to the present disclosure, it is possible to reduce the floor area of a substrate transport chamber when transporting a substrate using a magnetic levitation type substrate transport module.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An apparatus for transporting a substrate to/from a substrate processing chamber in which substrate processing is performed, the apparatus comprising:
   a substrate transport chamber connected to the substrate processing chamber, and including a side wall having an opening through which carry-in/out of the substrate to/from the substrate processing chamber is performed and a movement surface provided with a first magnet;
   a plate-shaped substrate transport module accommodated in the substrate transport chamber to hold the substrate, including a second magnet to which a magnetic force that is at least one of a repulsive force or an attractive force acting between the first magnet and the second magnet is applied, and configured to be movable along the movement surface in a state of floating from the movement surface using the magnetic force;
   an angle adjusting mechanism provided in the substrate transport chamber to switch an angle of the movement surface between a first angle and a second angle which is closer to a vertical state than the first angle; and
   a transport passage forming a portion of the substrate transport chamber, and including the movement surface at the second angle to which the movement surface switched to the second angle by the angle adjusting mechanism can be connected,
   wherein the angle adjusting mechanism includes a rotation shaft that is installed at an end portion of the movement surface and disposed to extend in a front-rear direction, and
   wherein the movement surface is configured to pivot around the rotation shaft.

2. The apparatus of claim 1, wherein the first angle is horizontal, and the second angle is an angle at which an inclination with respect to a horizontal direction is in a range of 45 to 90 degrees.

3. The apparatus of claim 2, wherein the substrate transport chamber is configured such that the carry-in/out of the substrate to/from the substrate processing chamber is performed using the substrate transport module that moves along the movement surface at the first angle, and
   wherein the angle adjusting mechanism is provided in a region between the transport passage and the opening.

4. The apparatus of claim 3, wherein the substrate transport chamber is configured to transport the substrate under a vacuum atmosphere,
   wherein a load-lock chamber in which the substrate that is carried-in to or carried-out from the substrate transport chamber is temporarily arranged, is configured to be able to switch an internal pressure of the load-lock chamber between a normal pressure and a vacuum and is connected to a position different from a position of the opening in the side wall of the substrate transport chamber, and
   wherein the substrate transport chamber is configured such that the substrate is delivered to and from the load lock chamber using the substrate transport module that moves along the movement surface at the first angle, and the angle adjusting mechanism of the substrate transport chamber is provided in a region between the load-lock chamber and the transport passage.

5. The apparatus of claim 4, wherein, in the transport passage, two movement surfaces at the second angle are disposed to face each other, and wherein the angle adjusting mechanism switches angles of two movement surfaces configured to be connected respectively to the two movement surfaces of the transport passage.

6. The apparatus of claim 5, wherein the two movement surfaces of the transport passage are disposed with a gap therebetween through which the substrate transport modules moving along the respective movement surfaces pass by each other.

7. The apparatus of claim 6, wherein, between the two movement surfaces, a partition member is provided to partition a space through which the substrate transport modules move along the respective movement surfaces.

8. The apparatus of claim 5, wherein, between the two movement surfaces, a partition member is provided to partition a space through which the substrate transport modules move along the respective movement surfaces.

9. The apparatus of claim 1, wherein the substrate transport chamber is configured such that the carry-in/out of the substrate to/from the substrate processing chamber is performed using the substrate transport module that moves along the movement surface at the first angle, and
wherein the angle adjusting mechanism is provided in a region between the transport passage and the opening.

10. The apparatus of claim 1, wherein the substrate transport chamber is configured such that the carry-in/out of the substrate to/from the substrate processing chamber is performed using the substrate transport module that moves along the movement surface at the second angle.

11. The apparatus of claim 1, wherein the substrate transport chamber is configured to transport the substrate under a vacuum atmosphere,
wherein a load-lock chamber in which the substrate that is carried-in to or carried-out from the substrate transport chamber is temporarily arranged, is configured to be able to switch an internal pressure of the load-lock chamber between a normal pressure and a vacuum and is connected to a position different from a position of the opening in the side wall of the substrate transport chamber, and
wherein the substrate transport chamber is configured such that the substrate is delivered to and from the load lock chamber using the substrate transport module that moves along the movement surface at the first angle, and the angle adjusting mechanism of the substrate transport chamber is provided in a region between the load-lock chamber and the transport passage.

12. The apparatus of claim 1, wherein, in the transport passage, two movement surfaces at the second angle are disposed to face each other, and
wherein the angle adjusting mechanism switches angles of two movement surfaces configured to be connected respectively to the two movement surfaces of the transport passage.

13. A system for processing a substrate, the system comprising:
an apparatus of claim 1 transporting the substrate; and
a plurality of substrate processing chambers connected to the substrate transport chamber through the opening.

14. A method of transporting a substrate to/from a substrate processing chamber in which substrate processing is performed, using
a substrate transport chamber connected to the substrate processing chamber, and including a side wall having an opening through which carry-in/out of the substrate to/from the substrate processing chamber is performed and a movement surface that is configured to pivot around a rotation shaft that is installed at an end portion of the movement surface and disposed to extend in a front-rear direction, provided with a first magnet, and
a plate shaped substrate transport module accommodated in the substrate transport chamber to hold the substrate, including a second magnet to which a magnetic force that is at least one of a repulsive force or an attractive force acting between the first magnet and the second magnet is applied, and configured to be movable along the movement surface in a state of floating from the movement surface using the magnetic force,
the method comprising:
switching an angle of the movement surface of the substrate transport module holding the substrate by pivoting the movement surface around the rotation shaft, between a first angle and a second angle which is closer to a vertical state than the first angle; and
transporting the substrate by the substrate transport module through a transport passage forming a portion of the substrate transport chamber, and including the movement surface at the second angle to which the movement surface switched to the second angle can be connected.

* * * * *